(12) United States Patent  
Blanchard

(10) Patent No.: US 7,728,275 B2
(45) Date of Patent: Jun. 1, 2010

(54) WIRELESS REMOTE DETECTOR SYSTEMS AND METHODS

(75) Inventor: Joseph Blanchard, Newton, MA (US)

(73) Assignee: FLIR Systems, Inc., Wilsonville, OR (US)

( * ) Notice: Subject to any disclaimer, the term of this patent is extended or adjusted under 35 U.S.C. 154(b) by 0 days.

(21) Appl. No.: 12/184,874

(22) Filed: Aug. 1, 2008

(65) Prior Publication Data

US 2009/0033336 A1 Feb. 5, 2009

Related U.S. Application Data

(60) Provisional application No. 60/953,726, filed on Aug. 3, 2007, provisional application No. 60/957,718, filed on Aug. 24, 2007.

(51) Int. Cl.
*H03K 17/78* (2006.01)
(52) U.S. Cl. .................... 250/214 SW; 324/522
(58) Field of Classification Search .......... 250/214 SW; 324/522
See application file for complete search history.

(56) References Cited

U.S. PATENT DOCUMENTS

| | | | | |
|---|---|---|---|---|
| 4,389,694 A | * | 6/1983 | Cornwell, Jr. ................. | 361/48 |
| 5,565,783 A | * | 10/1996 | Lau et al. .................... | 324/522 |
| 7,176,656 B2 | * | 2/2007 | Feldmann .................... | 320/114 |
| 7,528,612 B2 | | 5/2009 | Gollhardt et al. | |
| 7,561,412 B2 | | 7/2009 | Brandt et al. | |
| 2002/0008504 A1 | * | 1/2002 | Hameury ..................... | 324/96 |
| 2002/0075616 A1 | | 6/2002 | Montjean | |
| 2003/0057371 A1 | * | 3/2003 | Wood ......................... | 250/330 |
| 2003/0161084 A1 | * | 8/2003 | Potts et al. ................... | 361/62 |
| 2008/0211508 A1 | | 9/2008 | Conti et al. | |

FOREIGN PATENT DOCUMENTS

| | | |
|---|---|---|
| JP | 2002-281655 A | 9/2002 |
| KR | 10-2000-0064198 A | 11/2000 |
| KR | 10-2005-0087757 A | 8/2005 |
| KR | 10-2005-0092992 A | 9/2005 |
| KR | 10-2006-0129576 A | 12/2006 |

\* cited by examiner

*Primary Examiner*—Seung C Sohn
(74) *Attorney, Agent, or Firm*—Haynes and Boone, LLP

(57) ABSTRACT

A device for associating a circuit breaker with a circuit may have one or more sensors for remotely sensing that a circuit is active. When a sensor senses that a circuit is active, a transmitter may transmit a signal to a receiver that alerts a user. In this manner, the user may determine which of a plurality of different circuit breakers is associated with a particular circuit. This device mitigates the contemporary need to repeatedly turn off circuit breakers, go to the room in which the circuit is being monitored, and check to see if the circuit is active.

23 Claims, 9 Drawing Sheets

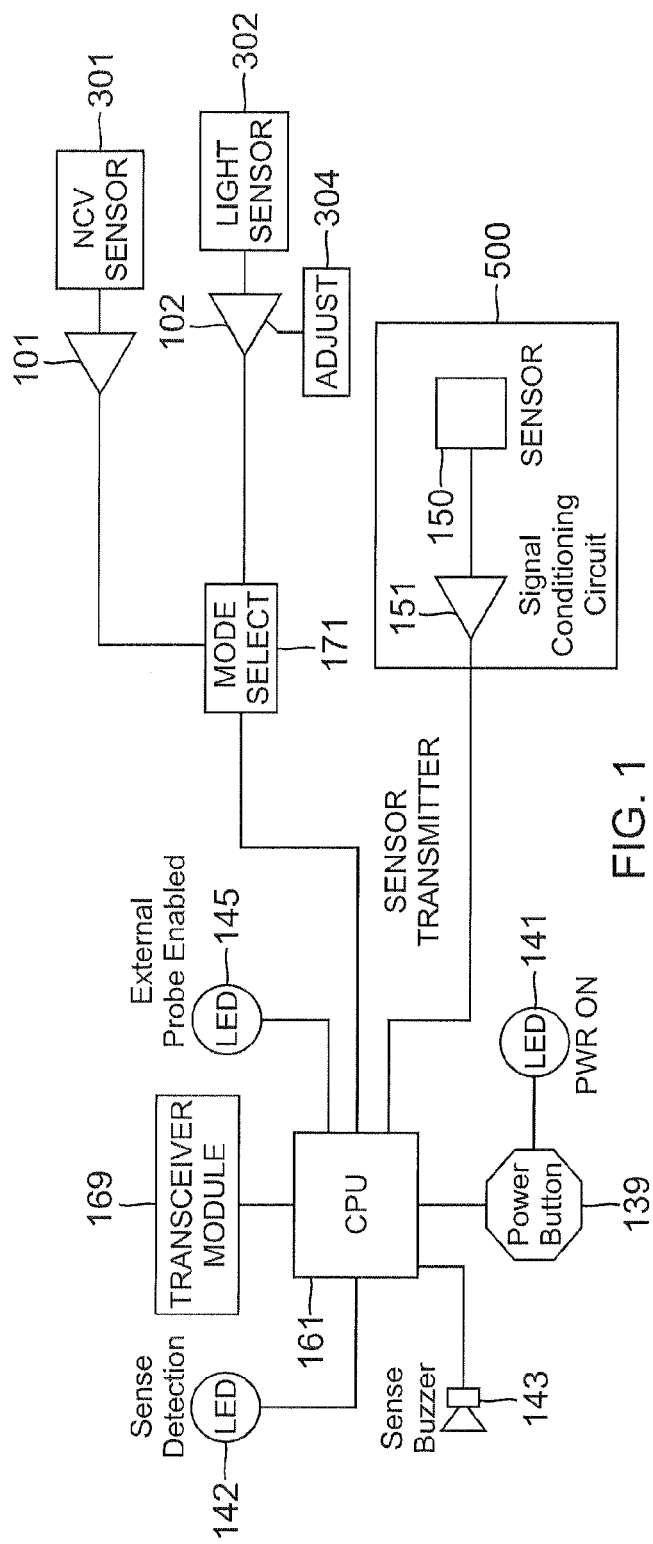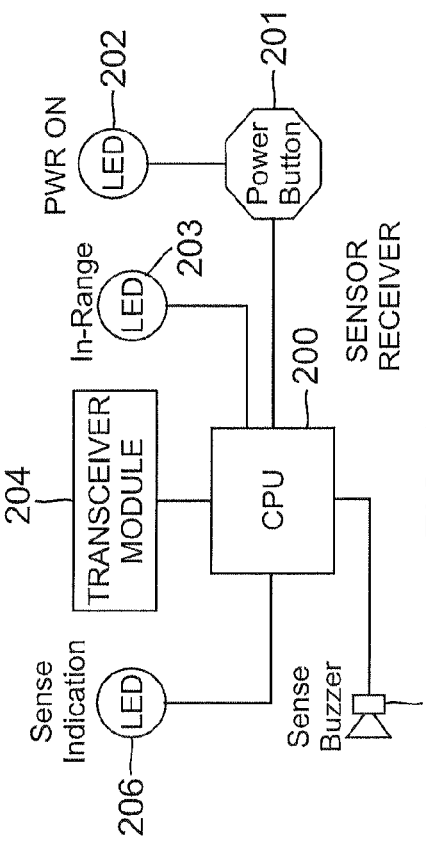

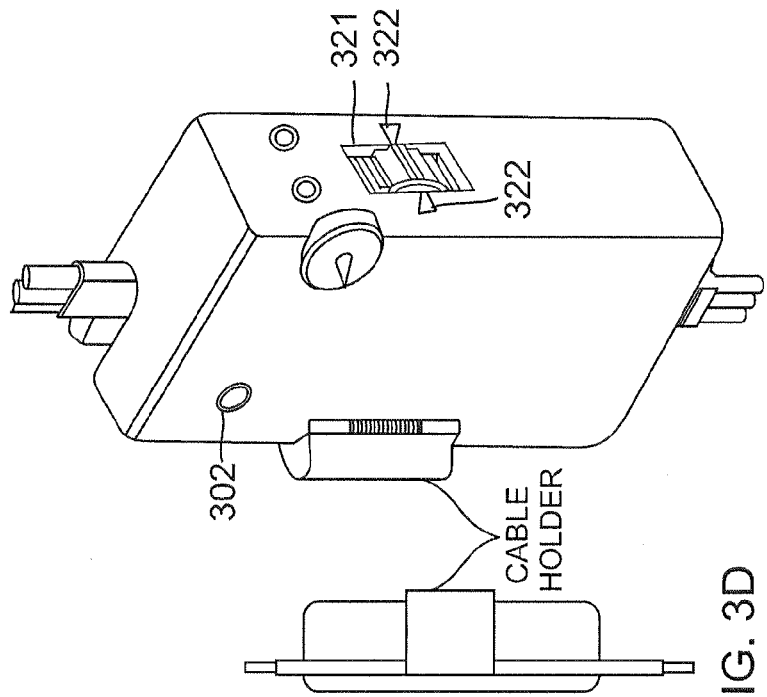
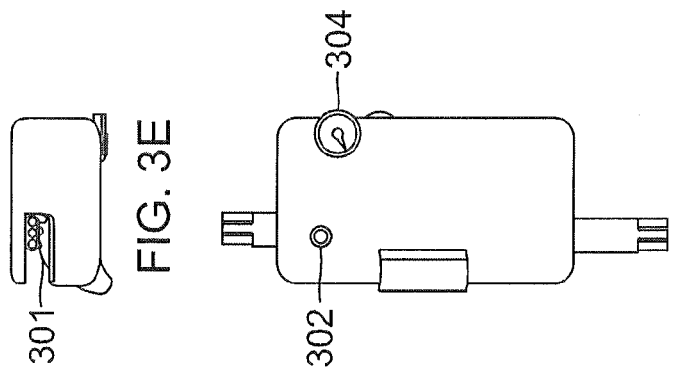
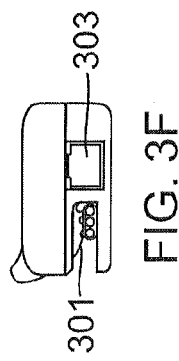
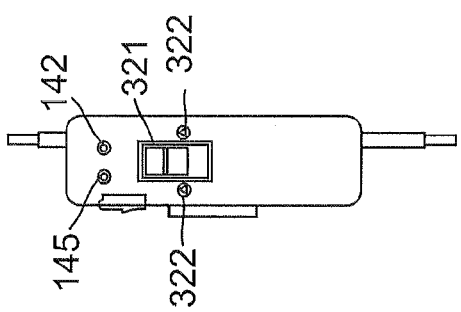

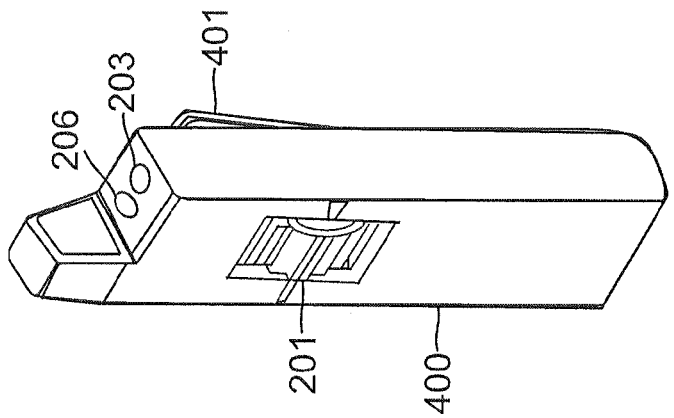
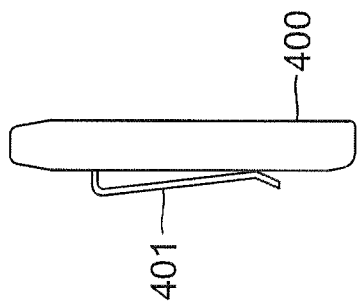
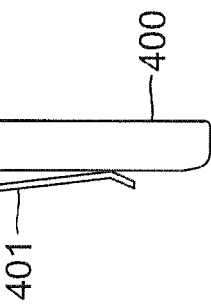
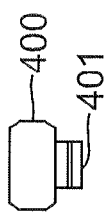
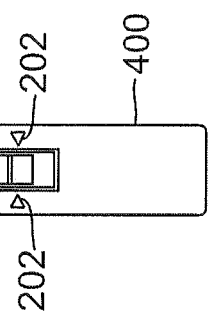
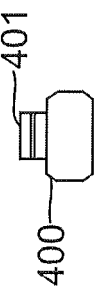

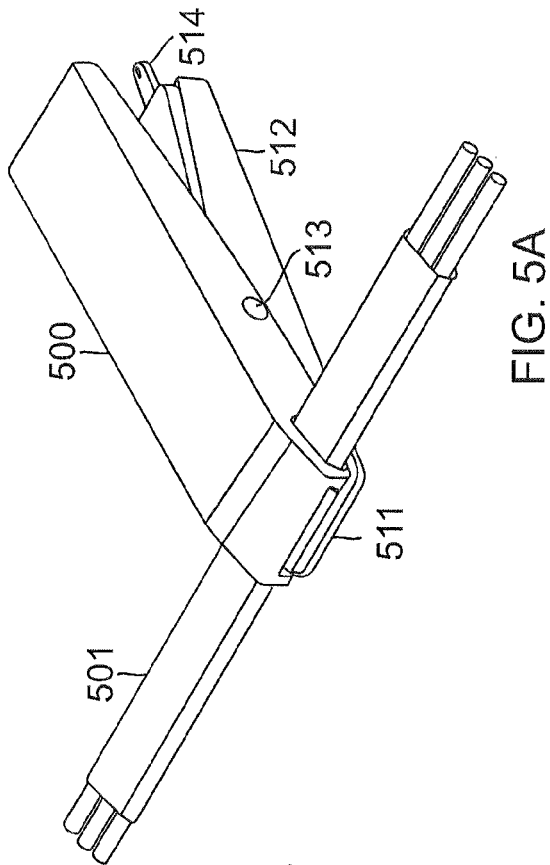
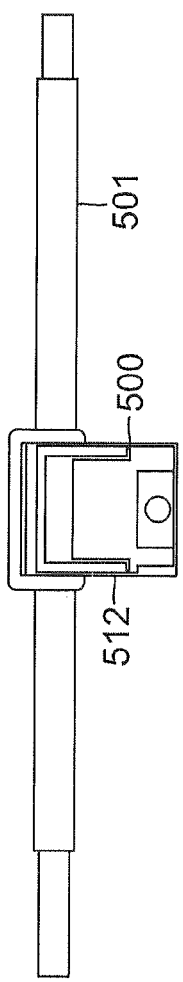
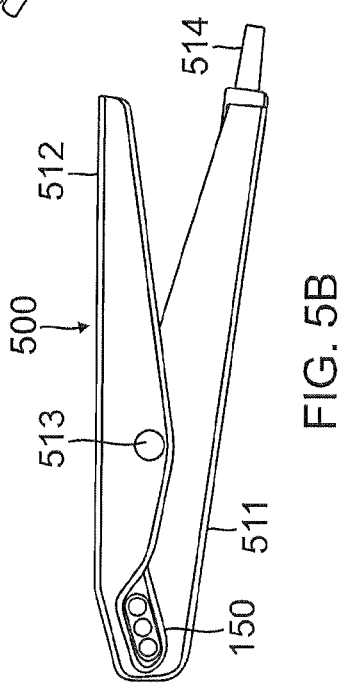
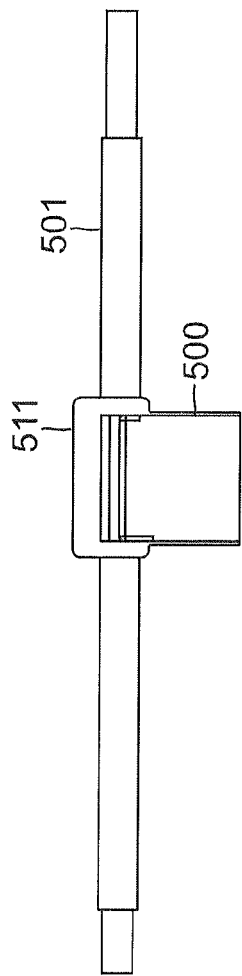

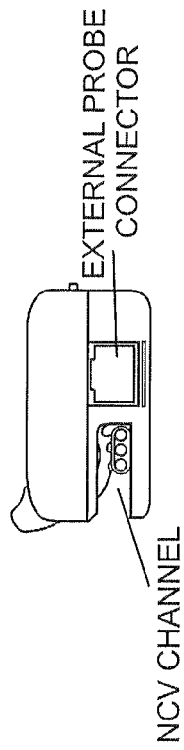
FIG. 7A
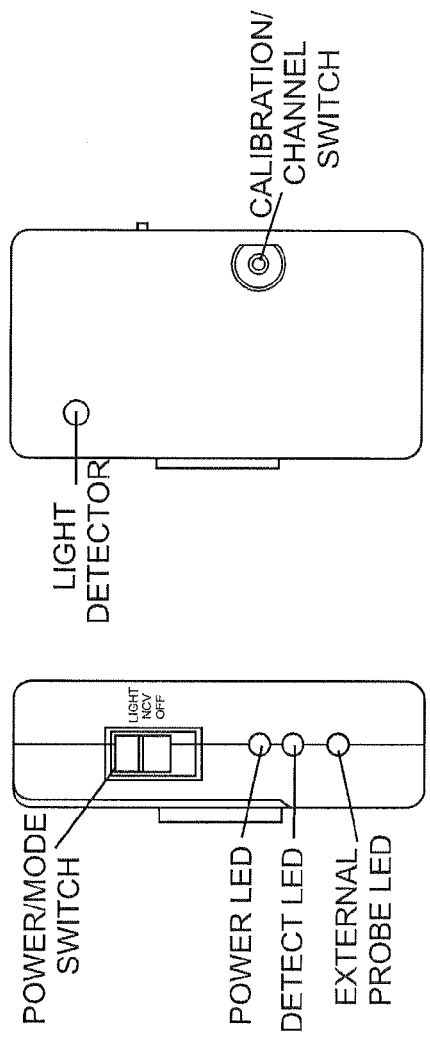
FIG. 7C
FIG. 7B
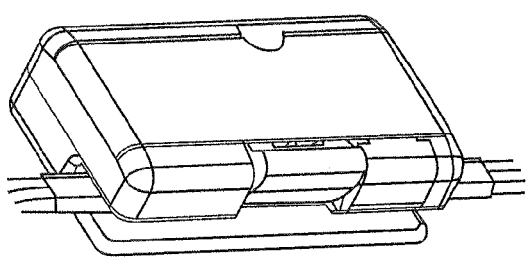
FIG. 6A
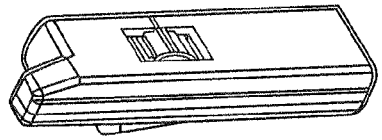
FIG. 6B

WIRELESS REMOTE DETECTOR SYSTEMS AND METHODS

PRIORITY CLAIM

This patent application claims priority to and the benefit of U.S. provisional patent application 60/953,726, filed on Aug. 3, 2007 and entitled Two Part Wireless Remote Non-Contact Detector System that Detects Voltage, Light, Sound, Heat, Motion and Continuity. This patent application also claims priority to and the benefit of U.S. provisional patent application 60/957,718, filed on Aug. 24, 2007 and entitled Two Part Wireless Remote Non-Contact Voltage Detector System that also Detects Light, Sound, Heat, Motion and Continuity. The entire contents of both of these provisional patent applications are hereby expressly incorporated by reference.

TECHNICAL FIELD

The present invention relates generally to electronics and more particularly, for example, to methods and systems for determining which of a plurality of different circuit breakers are associated with a particular line.

BACKGROUND

Circuit breakers for use in electrical circuits are well known. Circuit breakers trip automatically to disable a circuit in response to an overload or short circuit. In this manner, circuit breakers tend to prevent damage to electrical devices, fires, and harm to people.

Tripped circuit breakers can be reset. A circuit breaker is typically manually reset once the condition that caused the circuit breaker to trip no longer exists. Thus, after an overload has ceased or after a short circuit has been repaired, the circuit breaker can be reset.

BRIEF SUMMARY

Methods and systems are disclosed herein to facilitate the association of circuit breakers with circuits. That is, such methods and system may be used to identify, for example, which one of a plurality of different circuit breakers provide power to a particular, remotely located, alternating current (AC) line. As a specific example, the particular circuit breaker that is associated with a circuit that provides power to lights and wall outlets in one room of a home or office may be determined. The circuit breaker can be located in a circuit breaker panel that is outside of the home or office or that is remote with respect to the room within which the circuit is located.

In accordance with an example of an embodiment, a system for associating a circuit breaker with a circuit can comprise at least one sensor for determining if a circuit is active. The sensor can be either a contact sensor or a non-contact sensor.

A wireless transmitter can be in communication with the sensor(s) such that the wireless transmitter transmits a signal when an active circuit is sensed. A wireless receiver can be in communication with the transmitter and can alert a user when an active circuit is found or when a previously active circuit becomes inactive.

In accordance with an example of an embodiment, a system for associating a circuit breaker with a circuit can comprise means for sensing a voltage in a circuit. Means for transmitting a wireless signal can operate in response to sensing the voltage. Means for receiving the transmitted signal can provide an alert to the user when such a signal is received.

In accordance with an example of an embodiment, a method for associating a circuit breaker with a circuit can comprise sensing a voltage in a circuit or sensing ambient light within a room. When such a voltage or light is sensed, a wireless signal can be transmitted. When such a wireless signal is received, the user can be alerted to the presence of the voltage.

In this manner, there is no need to repeatedly turn off circuit breakers, go to the room in which the circuit is being monitored, and check to see if the circuit is active, as is done according to contemporary practice.

Embodiments of the present invention will be more fully understood in conjunction with the following detailed description taken together with the following drawings.

BRIEF DESCRIPTION OF THE DRAWINGS

FIG. 1 is a block diagram of a sensor/transmitter, according to an example of an embodiment;

FIG. 2 is a block diagram of a receiver/indicator, according to an example of an embodiment;

FIG. 3A is a perspective view of the sensor/transmitter, according to an example of an embodiment;

FIG. 3B is a front view of the sensor/transmitter, according to an example of an embodiment;

FIG. 3C is a right side view of the sensor/transmitter, according to an example of an embodiment;

FIG. 3D is a left side view of the sensor/transmitter, according to an example of an embodiment;

FIG. 3E is a top view of the sensor/transmitter, according to an example of an embodiment;

FIG. 3F is a bottom view of the sensor/transmitter, according to an example of an embodiment;

FIG. 4A is a perspective view of the receiver/indicator, according to an example of an embodiment;

FIG. 4B is a front view of the receiver/indicator, according to an example of an embodiment;

FIG. 4C is a right side view of the receiver/indicator, according to an example of an embodiment;

FIG. 4D is a left side view of the receiver/indicator, according to an example of an embodiment;

FIG. 4E is a top view of the receiver/indicator, according to an example of an embodiment;

FIG. 4F is a bottom view of the receiver/indicator, according to an example of an embodiment;

FIG. 5A is a perspective view of an external non-contact probe, according to an example of an embodiment;

FIG. 5B is a side view of an external non-contact probe, according to an example of an embodiment;

FIG. 5C is a front end view of an external non-contact probe, according to an example of an embodiment;

FIG. 5D is a back end view of an external non-contact probe, according to an example of an embodiment;

FIG. 6A is a perspective view of a sensor/transmitter, according to an example of an embodiment;

FIG. 6B is a perspective view of a receiver/indicator, according to an example of an embodiment;

FIG. 7A is a top view of a sensor/transmitter, according to an example of an embodiment;

FIG. 7B is a side view of a sensor/transmitter, according to an example of an embodiment;

FIG. 7C is a front view of a sensor/transmitter, according to an example of an embodiment;

Embodiments of the present invention and their advantages are best understood by referring to the detailed description that follows. It should be appreciated that like reference numerals are used to identify like elements illustrated in one or more of the figures.

DETAILED DESCRIPTION

Figure 9:
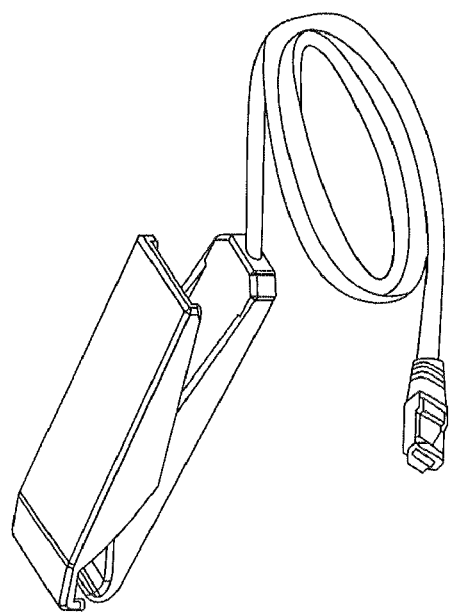
FIG. 9 is a perspective view of a probe, according to an example of an embodiment.

As an example, there are frequently situations wherein an existing alternating current (AC) line is to be used for adding an outlet, light fixture, or other electrical device. Often, such devices need to be installed from the mid-run section of the AC line. This can be at a considerable distance from the breaker panel or AC line termination point. Thus, determining which breaker is associated with the particular circuit or AC line can be difficult.

The AC line is cut and a junction box is installed to provide a splice that supplies power to the new device being installed. In order for the work to be completed, power must be turned off to the particular circuit and not to the entire facility or building. Often the breaker panel or termination point is not labeled. Even if the circuit breakers are labeled, it can still be difficult to identify the circuit breaker or AC line which powers the line that is to be used for re-work. The labels can be cryptic or ambiguous.

It is necessary to identify the proper AC line prior to cutting into it. This is important so as to avoid unnecessarily damaging another AC line. According to contemporary practice, considerable time can be spent tracing the AC line to the nearest receptacle. Once this is done, a voltmeter or light is plugged into the AC receptacle to identify the particular breaker that feeds this circuit. Even then, wiring from the receptacle to accessible areas of AC lines is difficult to trace.

For example, in order to identify the breaker that powers the particular light fixture according to contemporary methodology, groups of breakers are turned off, followed by a trip to the remote work area to check whether the lights are off. This trial and error method may require going back and fourth many times until the breaker is identified.

As a further example, an electrician can open one or more groups of breakers in the basement of a building. The electrician may then have to go to a remote area, such as the attic. In the remote area, the electrician connects a volt meter to the AC line. The volt meter may be connected to an outlet, a light socket, or the line itself.

Using this trial and error method the electrician may have to go back and fourth from the basement to the attic several times. Each time the electrician opens different breakers until the breaker for the AC line being worked on is identified, i.e., is associated with the breaker.

As another example, similar issues exist when attempting to identify a zone valve for a hot-water heating system according to contemporary practice. Typically, a user will close one valve, wait for the isolated pipe to cool, and then walk around the premises and physically touch a pipe in each zone to see if the proper zone has been isolated.

In accordance with one or more embodiments, methods and systems for associating a circuit breaker with a circuit are disclosed. Such methods and systems can substantially mitigate the amount of effort that is required to determine which circuit breaker is associated with a particular circuit, such as in a home or office. Such methods can similarly be used to identify a circuit breaker for an electrical line, a zone valve for a hot-water heating system, or for other similar types of applications.

In accordance with an example of an embodiment, a system for associating a circuit breaker with a circuit can have one or more sensors for remotely sensing that a circuit is active. When a sensor senses that a circuit is active, a transmitter can transmit a signal to a receiver that alerts a user. In this manner, the user can determine which of a plurality of different circuit breakers is associated with a particular circuit. This system mitigates the contemporary need to repeatedly turn off circuit breakers, go to the room in which the circuit is being monitored, and check to see if the circuit is active.

More particularly, a system for associating a circuit breaker with a circuit can comprise at least one sensor that is configured to sense the presence and/or absence of a parameter that is indicative of a circuit being active. For example, a sensor can sense the presence of a voltage or current in the circuit.

A sensor or group of sensors can sense one or more effects of current or voltage in a circuit. For example, one sensor can sense the presence or level of light in a room, another sensor can sense the presence of a heat source in the room, and another sensor can sense the presence or level of sound in a room. A change in the presence or level of a parameter can be an indication that the state of a circuit breaker for that room has changed.

Examples of sensors include voltage sensors, current sensors, continuity sensors, heat sensors (such as infrared or thermal sensors), light sensors, sound sensors, and/or motion sensors. More than one sensor can be used. Any desired combination of sensors can be used.

The sensors can comprise contact sensors or non-contact sensors. An example of a contact sensor is a voltage sensor where the sensor is in electrical contact with the AC line. An example of a non-contact sensor is a light sensor that senses ambient light within a room.

Another example of a non-contact sensor can be a voltage sensor that plugs into a wall outlet, but is not in electrical contact with the AC line. For example, plastic prongs or plastic covered prongs can be inserted into the wall outlet without providing such electrical contact. An induction sensor, for example, can be used to sense the presence of a voltage at the wall outlet.

Any desired combination of contact sensors and non-contact sensors can be used. For example, a contact voltage sensor such as a plug-in voltage sensor can be used with a non-contact, clamp on current sensor, a light sensor, a heat sensor, a sound sensor, and/or a motion sensor. Any parameter that indicates the presence or potential presence of voltage on an AC line or circuit can be used.

Thus, the system can detect the presence of voltage on an AC line or circuit by using contact or non-contact voltage detection, by using non-contact current detection, by using sound detection, by using heat detection, by using motion detection, by using light detection, by using continuity detection, or by using any combination thereof.

The sensing of other parameters such as sound, heat, light, sound, and motion may be used to detect the presence of AC voltage indirectly. The sensing of such parameters allows the effects of voltage on the AC line or circuit to be monitored. These effects are generally indicative of the presence of voltage on the AC line or circuit. For example, sound can be sensed from a motor, such as the motor of a fan. Heat can be sensed from a light, a heater, or a computer. Light can be sensed from a light or computer monitor. Motion can be sensed from a fan.

A wireless transmitter can be in communication with the sensor or sensors. Thus, the wireless transmitter can receive a signal from the sensor(s). The sensor or sensors can be packaged either with or separately with respect to the wireless transmitter. One or more sensors can be packaged with the wireless transmitter and one or more sensors can be packaged separately with respect to the wireless transmitter.

The wireless transmitter can comprise a radio frequency wireless transmitter. For example, the wireless transmitter can comprise a cellular telephone transmitter, a Bluetooth® transmitter, a WiFi® transmitter, and/or a WiMAX® transmitter. The wireless transmitter can comprise any desired type of transmitter and/or transmission standard (such as a wireless interface standard or protocol).

A wireless receiver can receive a signal from the wireless transmitter. The signal can indicate a change in the state of one or more parameters. The change of state of parameter or parameters can indicate that the state of the circuit has changed.

For example, opening a circuit breaker can cause the voltage provided by a wall outlet to drop to zero and/or can cause the lights in a room to go out. These changes of state in parameters, i.e., voltage and light, can cause the wireless transmitter to send a signal to the wireless receiver.

The signal received by the wireless receiver can cause an indicator to change state. For example, in response to the signal, a light or an audible indicator can change state from on to off, or visa-versa. In this manner, the user is alerted that changing the state of a circuit breaker has caused a change of state of a particular circuit. Thus, the circuit breaker for which the state was changed is associated with the circuit for which the state was changed.

The sensor/transmitter can comprise an ambient light sensor that senses the level of light prior to changing the state of a circuit breaker such that changes in ambient lighting are more readily determined. The ambient light sensor can be used to monitor the state of a lamp, for example.

In accordance with an example of an embodiment, various features can be provided in a hand held device (a receiver/indicator) for local readings, and a device for remote operation (a sensor/transmitter). The receiver/indicator and the sensor/transmitter can communicate, either unidirectionally (where the sensor/transmitter transmits to the receiver/indicator) or bidirectionally (where the sensor/transmitter and the receiver/indicator each transmit to one another such as via the use of transceiver), such as by using radio frequency (RF) wireless technology. Bidirectional communication can facilitate the changing of parameters or settings of the sensor/transmitter from the receiver/indicator. For example, the sensor/transmitter can be changed from a voltage sensing mode to a light sensing mode by remote control (such as by a control of the receiver/indicator).

Such features can include a wireless remote mid-run non-contact AC line voltage detector, a wireless remote non-contact AC power receptacle voltage detector, a wireless remote light detector, a wireless remote thermal detector, a hand held non-contact voltage (NCV) detector, and/or a wireless remote breaker finder.

In accordance with an example of an embodiment, an RF transceiver can be used to remotely detect voltage, light or temperature. Non-contact voltage sensing can be used to detect voltage in mid-run AC wiring or power receptacles. Light from any light source can be detected while heat in piping used in home heating systems can also be detected.

In accordance with an example of an embodiment, a hand held non-contact voltage (NCV) detector can be provided. The non-contact voltage detector can be used to locate and/or identify existing wiring, circuit breakers which feed power to AC lines, AC outlets and light fixtures.

In accordance with an example of an embodiment, heat in piping used in home heating systems can also be detected. Such heat can be used to identify heating system piping for checking heating zone functionality and/or identify the zone valve which controls a particular heating zone.

In accordance with an example of an embodiment, an AC power line can be identified, e.g., associated with a circuit breaker, in mid-run without cutting the wire. Circuit identification can be accomplished for mid-run AC power circuits, junction boxes, receptacles or light fixture connections.

An electrician can connect the sensor/transmitter to a live AC line in mid-run. The electrician can then look to check to verify that voltage is present. Then the electrician can go (such as with the receiver/indicator in hand) to the breaker panel or the AC junction point. Signals from the sensor/transmitter are picked up by the receiver/indicator.

If voltage is present, an RF signal comprising a voltage present code can be generated and transmitted from the sensor/transmitter to the receiver/indicator. The electrician can then switch circuit breakers on and off or disconnect and re-connect the AC lines one at a time until the tone stops and voltage present LED turns off, thereby identifying which breaker or the AC line at the breaker panel feeds that particular mid-run AC power line.

A similar process can be used for locating the breaker that powers light. Similarly, this can be used for identifying and checking operation of heating zone valves. All sensing methods which include mid-run AC line, AC receptacle voltage detection, light and heat use this proprietary circuit design.

Circuit breakers associated with an AC power line, such as an AC power line that provides power to lighting fixtures, can readily be identified. This is particularly useful in those instances wherein the lighting fixtures are a considerable distance from the breaker panel, such as in a different area of the building. A light sensing circuit can be used to detect whether a light is switched on or off. A heat sensor can be used to identify zone valves, such as by determining whether or not hot water is flowing through a pipe.

According to an example of an embodiment, a device can be used to detect voltage (such as without contacting the conductor), to detect light, and to sense heat. The device can send an indication of the on or off state of the circuit or heating zone wirelessly to another device, such as by using an RF transmitter or transceiver.

The device can sense AC voltage in a wire feeding a particular AC circuit, and/or can sense light from a light fixture that is in a particular AC circuit. The device can sense light from a light source in any room of a house or commercial building.

According to an example of an embodiment, a system comprises a two part device. One part can comprise a commercial RF transmitter and the other part can comprise a commercial RF receiver. One part can be a sensor/transmitter and the other part can be a receiver/indicator. When voltage or light is sensed, by the sensor/transmitter an indication is wirelessly transmitted back to a second device (receiver/indicator) held by the user located at the breaker panel or remote location.

To identify a breaker of a particular AC line, such as an AC line that requires re-work, the user can, for example, attach the sensor/transmitter to this AC line. Such attachment can be performed using a built in cable holder.

Alternatively, such attachment can be performed by plugging the sensor/transmitter into a wall outlet. An external plug can have plastic spades such that the plug does not make electrical contact with the receptacle contacts. When the sensor/transmitter is turned on, a sense mode can be selected, either manually or automatically. The sensor/transmitter can detect the presence of AC voltage on this line and/or receptacle, such as by using non-contact voltage sensing. The sensor/transmitter can detect the presence of light in the room. The presence of light can be detected instead of or in addition to detection of voltage. The presence of voltage and/or light can be indicated on the sensor/transmitter by the lighting of an LED and/or the sounding of an audible indicator, for example.

The sensor/transmitter can begin wirelessly transmitting an indication of the sense state. Thus, the sensor/transmitter can transmit a signal that indicates whether AC voltage has been sensed and/or whether light has been sensed. The presence of AC voltage and/or light can be an indication that a particular AC line or circuit is active. Other parameters, such as heat, current, and/or sound can similarly be sensed instead of or in addition to AC voltage and/or light.

The user can leave the room where the sensor/transmitter is operating and can move to the breaker panel, junction point, or to any other desired location so as to identify the breaker or AC line that is associated with the AC being monitored by the sensor/transmitter.

The user can turn on the hand held receiver/indicator. The receiver/indicator can receive the signal from the sensor/transmitter. The receiver/indicator can acknowledge reception of the signal to the user. For example, the receiver/indicator can indicate reception to the user by lighting a green LED. A red LED can illuminate and/or an audible indicator can sound to indicate that AC voltage has been sensed by the sensor/transmitter. As discussed herein, the AC voltage can be sensed directly, such as by either contact or non-contact voltage detection, by non-contact current detection, by contact continuity detection, by sound detection, by heat detection, by motion detection, or by any combination thereof.

After seeing the LED illuminate or hearing the beeping sound (which indicates the presence of voltage on the AC line or circuit at the remote location) on the receiver/indicator, the user can sequentially switch the circuit breakers off and on or disconnect the AC wires at the junction point in order to identify the breaker or wire which powers the AC line or circuit at the remote location.

When the particular circuit breaker that powers the AC line is turned off, then the state of the indicator on the receiver/indicator changes, indicating that the breaker or wire for the AC circuit at the remote location has been identified. Thus, the LED on the receiver/indicator turns off and/or the audible indicator turns off. Alternatively, the LED on the receiver/indicator can be off and/or the audible indicator can be off when AC voltage is present at the remote location and can turn on when the AC voltage is removed.

Once the circuit breaker has been opened and/or AC line has been disconnected, then the desired work can be performed at the remote location. The circuit breaker can be closed and/or AC line can be re-connected, after the desired work has been completed.

For heating valve location, rather than a voltage sensor or light sensor, a heat sensor can used. Thus, a potential source of power or heat to the heating valve or pipe can be removed in an analogous fashion to the opening of circuit breakers described above. These potential sources of power or heat can be heaters (either gas or electric, for example) or can be fluid, such as hot water. Circuit breakers, switches, and/or valves can be cycled on and off to determine which one affects the monitored location. Once the circuit breaker, switch, or valve is identified, then it can be left off or open until the desired repair is completed. Instead of or in addition to a heat sensor, a leak detector can be used. For example, a water leak detector or a gas (such as natural gas) leak detector can be used to monitor a pipe while remotely located valves are shut off to determine which valve controls the leaking pipe.

According to an example of an embodiment, a two part system can enable one person, working alone, to remotely monitor the status of various sensed conditions such as voltage, current, continuity, light, sound motion and heat. The system can comprise a sensor/transmitter as shown in FIGS. 1 and 3A-3F and a receiver/indicator as shown in FIGS. 2 and 4A-4F. The sensor/transmitter can sense a parameter that is indicative of an AC line being active, e.g., having a voltage thereon, and can transmit a wireless signal representative of a state of the sensed parameter. The sensor/transmitter can have a built-in non-contact voltage and/or current sensor as shown in FIGS. 3A-3F. The sensor/transmitter can have an external non-contact voltage and/or current sensor as shown in FIGS. 5A-5D.

The receiver/indicator can receive a wireless signal that is representative of a sensed parameter and can provide an indication of the state of the sensed parameter to a user. The sensor/transmitter and the receiver/indicator can be remotely located with respect to one another. For example, the sensor/transmitter and the receiver/indicator can be in different parts of a building.

Referring now to FIGS. 3A-3F, the sensor/transmitter can be a handheld device comprising a built-in, non-contact sensor 301 (FIGS. 3E and 3F) that is configured to detect voltage and/or current without electrically connecting to the copper wires of an AC line. Such a voltage sensor can be a capacitively coupled sensor, for example. Such a current sensor can be an inductively coupled sensor or can be a Hall effect device, for example.

The sensor/transmitter can comprise a built-in light sensor 302. The sensor/transmitter can comprise any type of sensor that provides an indication that an AC line or circuit has voltage applied thereto. For example, the sensor/transmitter can comprise a voltage sensor, a current sensor, a continuity sensor, a heat sensor, a light sensor, a sound sensor, and/or a motion sensor.

The sensor/transmitter can comprise one or more input jacks 303, such as RJ45 receptacles. Each input jack 303 can be used to connect an input sensor or probes. For example, the input jack 303 can be used to connect an external sensor such as: NCV, Light, Temperature etc. It also has a green Power-on LED 322, a red sense indication LED 142 and a 3-position slide switch 321. This 3-position slide switch is used to select power-off, built-in NCV or light detect functions, for example.

Referring now to FIG. 1, a block diagram of the sensor/transmitter is shown. The sensor/transmitter can comprise a CPU 161. The CPU 161 can comprise a microprocessor (or other logic circuitry) and the associated circuitry necessary to process information from the sensor(s) and to transmit a signal representative of this information to the receiver/indicator. The CPU 161 can comprise a general purpose microprocessor, a custom microprocessor, a logic circuit, or any combination thereof.

The non-contact voltage sensor (NCV) 301 can provide an output to a signal conditioning circuit 101. The non-contact voltage sensor 301 can detect the presence of AC voltage on insulated electrical wires without contacting the metal conductors thereof. The signal conditioning circuit 101 can amplify, filter, or otherwise modify or condition the output of non-contact voltage sensor 301 according to well-known principles.

Similarly, the light sensor 302 provides an output to a signal conditioning circuit 102. The signal conditioning circuit 102 can amplify, filter, or otherwise modify or condition the output of light sensor 302 according to well-known principles. The light sensitivity adjustment 304 can be used to compensate for the level of ambient lighting, as discussed herein. Sensitivity adjustment 304 can comprise a potentiometer that is used to set light threshold detection level of the on-board light sensor. The sensitivity level can be set automatically as discussed below.

A mode select 171 can select either the non-contact voltage sensor 301, the light sensor 302, or both the non-contact voltage sensor 301 and the light sensor 302 to monitor. The mode select 171 can be responsive to a manual control of the sensor/transmitter, such as the slide switch 321 (FIG. 3A) thereof.

An external probe 500 (see also FIGS. 5A-5D) can be connected to the sensor/transmitter, such as via RJ-45 connector 303 (FIG. 3F). The external probe 500 can comprise a sensor 150, such as a non-contact voltage sensor, and a signal conditional circuit 151. The signal conditioning circuit 151 can amplify, filter, or otherwise modify or condition the output of non-contact voltage sensor 150 (e.g., sensor 301) according to well-known know principles. An external probe LED 145 can illuminate to indicate the presence of and/or proper functioning of an external probe, such as that shown in FIGS. 5A-5D.

A power button 139 can be used to turn the sensor/transmitter on and off. A power on red LED 141 can illuminate to indicate that the sensor/transmitter is turned on.

Transceiver module 169 can facilitate communication with the receiver/indicator. The transmitter module 169 can facilitate bi-directional communication with the receiver/indicator. Alternatively, a transmitter can be used instead of a transceiver. Of course, a transmitter will only facilitate unidirectional communication from the sensor/transmitter to the receiver/indicator.

A sense indication red LED 142 and/or a sense buzzer 143 can provide an indication of a change of state of the parameter being monitored by the sensor/transmitter. For example, the sense indication red LED 142 can illuminate and/or the sense buzzer 143 can sound in response to the sensor/transmitter detecting a voltage on the AC line and/or detecting ambient light above a predetermined level at the remote location.

Referring now to FIGS. 5A-5D, the external probe can comprise a clamp 511, handles 512 and a hinge 513. The clamp 511 and handles 512 can be configured in the general fashion of the clamp and handles of the connectors of common automobile jumper cables. Thus, the clamp 511 can be applied to an AC line 501 by squeezing the handles 512 in a manner similar to the attachment of a battery jumper cable to a car battery terminal.

The clamp 511 can comprise a non-contact voltage sensor 150. The non-contact voltage sensor 150 is configured to sense the presence of a voltage on the AC line, thus indicating that the AC line is active and must be turned off prior to performing work thereon.

The external probe 500 can be attached to the sensor/transmitter by a cable 514, such as an 18 inch to 24 inch cable that plugs into the RJ-45 connector of the sensor/transmitter. Alternatively, the external probe 500 can communicate with the sensor/transmitter wirelessly, such as in the same manner in which the sensor/transmitter communicates with the receiver/indicator. As a further alternative, the external probe 500 can communicate directly (without the use of a sensor/transmitter) with the receiver/indicator.

The external probe 500 can be configured to detect one or more parameters such as voltage, current, continuity (contact closure), heat, light, sound, and motion.

The external probe 500 can comprise the same or similar non-contact voltage sensing circuitry as the sensor/transmitter. When the external probe 500 is plugged into the RJ45 jack 303 of the sensor/transmitter, then the internal non-contact voltage sensing circuit of the sensor/transmitter can be disconnected and the remote NCV circuit can be connected to the microprocessor 161 of the sensor/transmitter. Thus, the function of the sensor/transmitter can be generally the same regardless of whether sensing is performed locally (buy a built-in sensor of the sensor/transmitter) or remotely (by an external probe).

The sensor/transmitter can provide a wireless output that is received by the receiver/indicator (FIGS. 2 and 4A-4F). The output can comprise a signal that is transmitted when the on board non-contact voltage or light sensor has detected voltage or light above the threshold level.

The sensor/transmitter can comprise one or more indicator lights. For example, the sensor/transmitter can comprise a power on indicator 141 that illuminates to indicate that the sensor/transmitter is turned on. For example, the sensor/transmitter can have a slide switch 321 for turning the sensor/transmitter on. The slide switch 321 can turn the sensor/transmitter on in a selected one of two different modes. The slide switch 321 can turn the sensor/transmitter on in a non-contact voltage mode, where voltage of the AC line is sensed. The slide switch 321 can turn the sensor/transmitter on in a light sensing mode, wherein the ambient light level is sensed. Green arrow LEDs 322 can turn on when the slide switch is placed in the non-contact voltage sensing and/or light position.

The sensor/transmitter can comprise a sensor detection indicator 142 that illuminates to indicate that a sensor has made a detection. For example, a red LED can illuminate when an voltage is sensed on the AC line or when an increase (or decrease) in ambient light is detected from the on-board sensors or from the external probe 500.

The sensor/transmitter can comprise an external sensor activation indicator 145. For example, a round yellow LED can illuminate to indicate that an external sensor is plugged into the RJ45 connector and is functional. When an external sensor is plugged in, the onboard sensors can be disabled.

The sensor/transmitter can comprise a three position slide switch 321 as discussed above. The three positions can include OFF, NCV (non-contact voltage), and Light. In the OFF position, the sensor/transmitter is disabled (turned off).

When the slide 321 is in the NCV position, the sensor/transmitter can be configured to sense the presence of a voltage on the AC line. When the slide 321 is in the NCV position, red LED 142 turns on when a voltage is detected on the AC line or when the external sensor is activated.

When the slide switch 321 is in the Light position, the sensor/transmitter is configured to sense the presence of ambient light. When the slide switch 321 is in the Light position, the red LED turns on when the light above the threshold level is detected or the external sensor is activated.

As discussed above, an external non-contact voltage, light, or heat (temperature) sensor can be plugged into the sensor/transmitter via the RJ45 connector 303. The sensor/transmitter can be configured to provide automatic sensor or probe recognition.

Referring now to FIG. 2, the receiver/indicator can comprise a CPU 200. The CPU 200 can comprise a microprocessor (or other type of logic circuit) and the associate circuitry necessary to process information from the sensor/transmitter and to provide indications representative thereof. The CPU 200 can comprise a general purpose microprocessor, a custom microprocessor, a logic circuit, or any combination thereof.

A power button 201 can allow the receiver/indicator to be turned on and off. A red power on indicator LED can illuminate to indicate that the power button 201 has been pushed to turn power on. A green in-range LED 203 can illuminate to indicate that the receiver/indicator is receiving a signal from the sensor/transmitter.

Transceiver module 204 facilitates communication with the remotely located sensor/transmitter. The transceiver module 204 can facilitate bi-directional communication with the sensor/transmitter. Alternatively, a receiver can be used instead of a transceiver. Of course, a receiver will only facilitate unidirectional communication from the sensor/transmitter to the receiver/indicator.

A sense indication red LED 206 and/or a sense buzzer 207 can provide an indication of a change of state of the parameter being monitored by the sensor/transmitter. For example, the sense indication red LED 206 can illuminate and/or the sense buzzer 207 can sound in response to the sensor/transmitter detecting a voltage on the AC line and/or detecting ambient light above a predetermined level at the remote location.

Referring now to FIGS. 4A-4F, the receiver/indicator can comprise a housing 400 that is configured to attach to a user's clothing. For example, a clip 401 can be attached to the housing so as to facilitate attachment of the receiver/indicator to a user's belt or pocket. The receiver/indicator can be configured to be hand held.

Power switch 201 can comprise a three position slide switch that has an OFF position, an ON position, and a silent position. The silent position can disable the sense buzzer 207 for silent operation.

Two green power-on arrows LEDs 202 can provide an indication that the receiver/indicator is turned on. A red sense indication LED 206 can provide an indication that a sensed parameter is within a predetermined range. For example, red sense indication LED 206 can illuminate to indicate that a voltage is being sensed on an AC line by the sensor/transmitter and/or that ambient light above a threshold level is being sensed by the sensor/transmitter.

A yellow in-range LED 203 can illuminate to indicate that the receiver/indicator is within range of the sensor/transmitter.

EXAMPLE OF USE NO. 1

Figure 12:
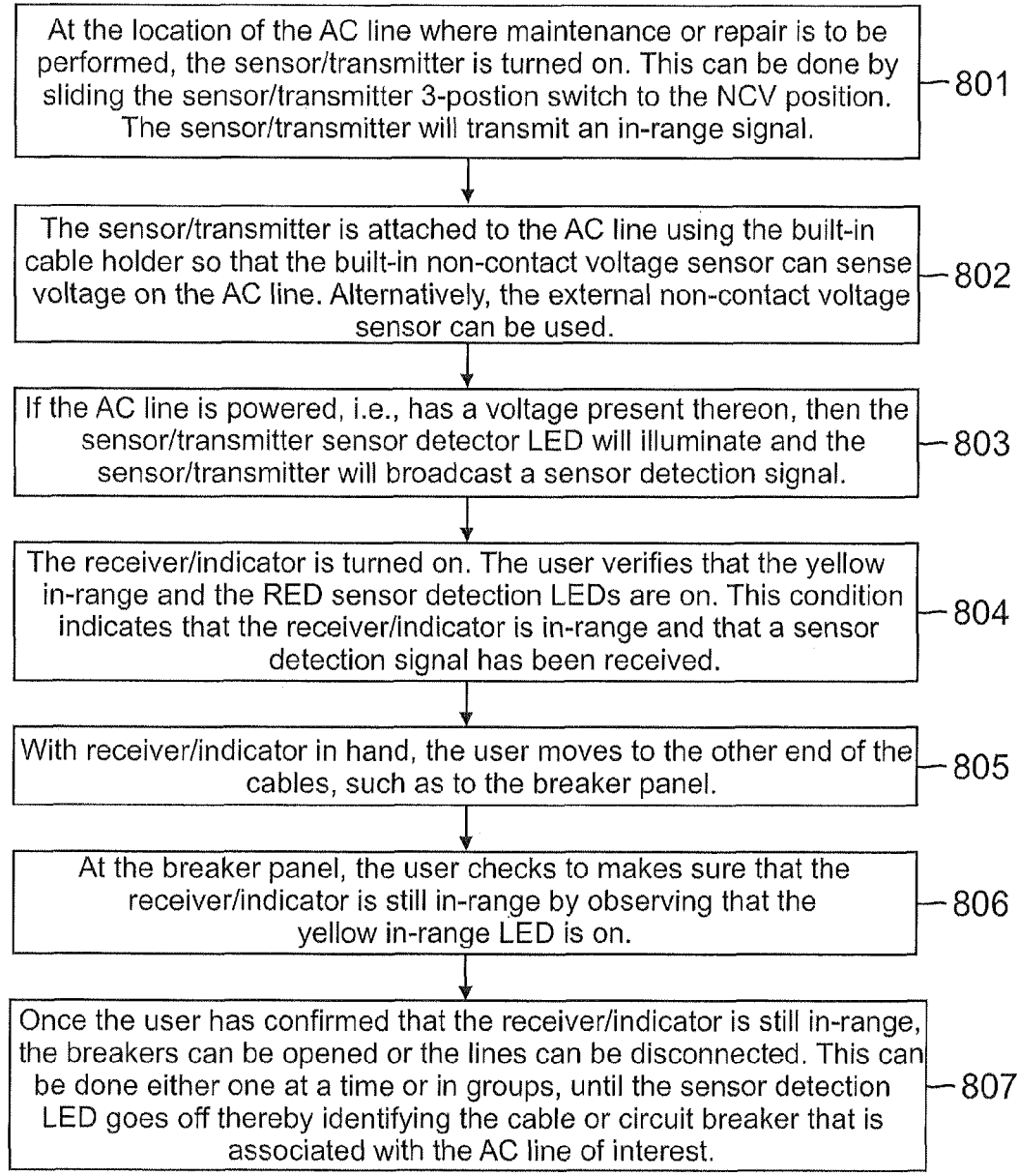
FIG. 12 is a flow chart showing the use of a sensor/transmitter and a receiver/indicator, according to an example of an embodiment.

Referring now to FIG. 12, according to a typical application of an example of an embodiment, non-contact voltage sensing is used to identify the particular circuit breaker that is associated with a remotely located AC line. This is done by a single person, e.g., without the assistance of a helper.

The sensor/transmitter is used to sense the presence of a voltage of an AC line as the remotely located circuit breakers are cycled between on and off. When the circuit breaker associated with the AC line is opened, then the user is alerted.

More particularly, the following procedure is followed:

1) At the location of the AC line where maintenance or repair is to be performed, the sensor/transmitter is turned on, as indicated in block 801. This can be done by sliding the sensor/transmitter 3-position switch to the NCV position. The sensor/transmitter will transmit an in-range signal.

2) The sensor/transmitter is attached to the AC line using the built-in cable holder so that the built-in non-contact voltage sensor 301 can sense voltage on the AC line, as indicated in block 802. Alternatively, the external non-contact voltage sensor 500 can be used.

3) If the AC line is powered, i.e., has a voltage present thereon, then the sensor/transmitter sensor detector LED will illuminate and the sensor/transmitter will broadcast a sensor detection signal, as indicated in block 803.

4) The receiver/indicator is turned on, as indicated in block 804. The user verifies that the yellow in-range and the RED sensor detection LEDs are on. This condition indicates that the receiver/indicator is in-range and that a sensor detection signal has been received.

5) With receiver/indicator in hand, the user moves to the other end of the cables, such as to the breaker panel, as indicated in block 805.

6) At the breaker panel, the user checks to make sure that the receiver/indicator is still in-range by observing that the yellow in-range LED is on, as indicated in block 806.

7) Once the user has confirmed that the receiver/indicator is still in-range, the breakers can be opened or the lines can be disconnected, as indicated in block 807. This can be done either one at a time or in groups, until the sensor detection LED goes off thereby identifying the cable or circuit breaker that is associated with the AC line of interest.

EXAMPLE OF USE NO. 2

Figure 13:
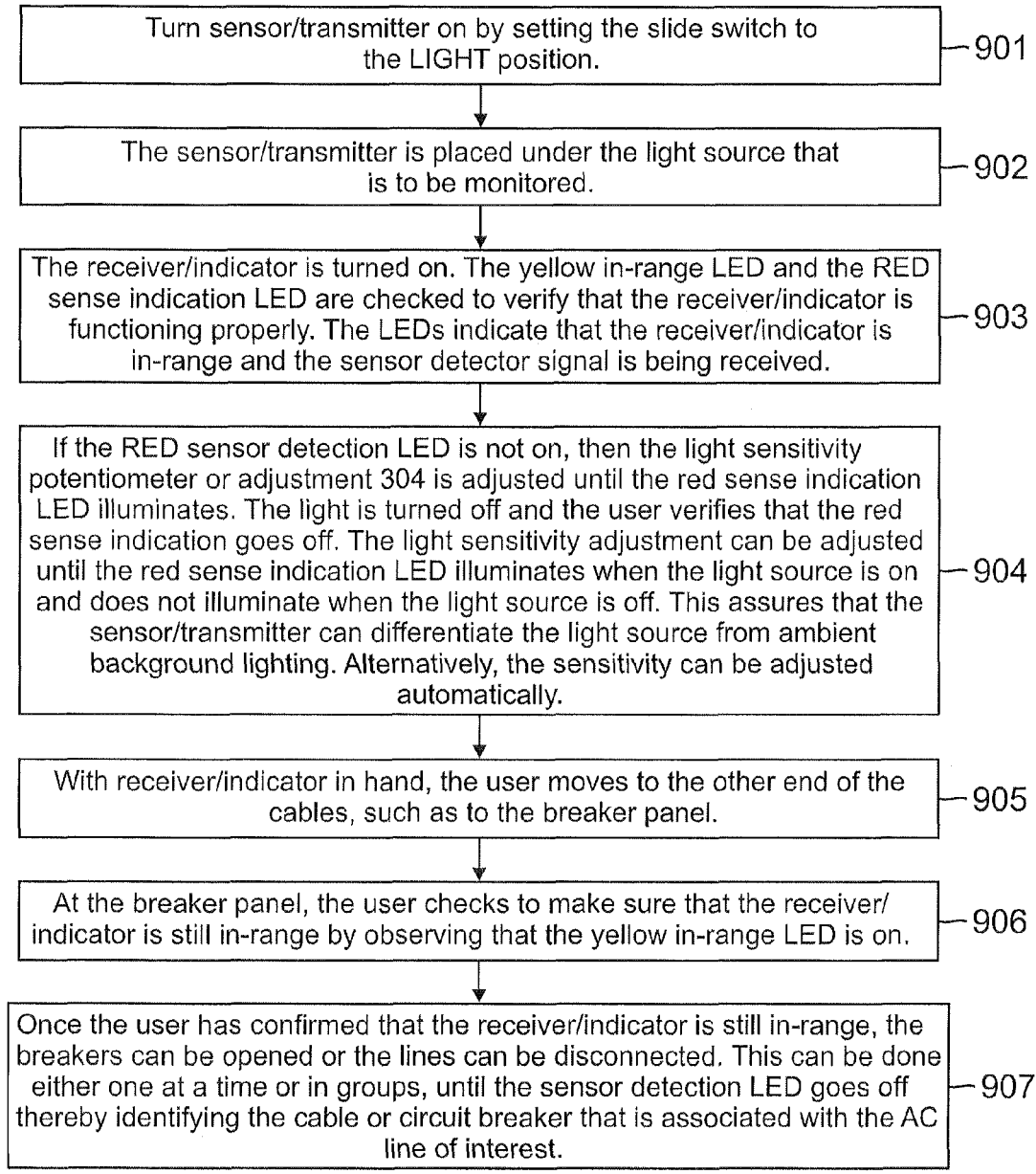
FIG. 13 is a flow chart showing the use of a sensor/transmitter and a receiver/indicator, according to an example of an embodiment.

Referring now to FIG. 13, according to a another typical application of an example of an embodiment, light voltage sensing is used to identify the particular circuit breaker that is associated with a remotely located AC line. Again, this is done by a single person, e.g., without the assistance of a helper.

The sensor/transmitter is used to sense a change in the ambient lighting as the remotely located circuit breakers are cycled between on and off. When the circuit breaker associated with the AC line is opened, then the user is alerted.

More particularly, the following procedure is followed:

1. Turn sensor/transmitter on by setting the slide switch to the LIGHT position, as indicated in block 901.

2. The sensor/transmitter is placed under the light source that is to be monitored, as indicated in block 902.

3. The receiver/indicator is turned on, as indicated in block 903. The yellow in-range LED and the RED sense indication LED are checked to verify that the receiver/indicator is functioning properly. These LEDs indicate that the receiver/indicator is in-range and the sensor detector signal is being received.

4. If the RED sensor detection LED is not on, then the light sensitivity potentiometer or adjustment 304 is adjusted until the red sense indication LED illuminates, as indicated in block 904. The light is turned off and the user verifies that the red sense indication goes off. The light sensitivity adjustment can be adjusted until the red sense indication LED illuminates when the light source is on and does not illuminate when the light source is off. This assures that the sensor/transmitter can differentiate the light source from ambient background lighting. Alternatively, the sensitivity can be adjusted automatically, as discussed below.

5) With receiver/indicator in hand, the user moves to the other end of the cables, such as to the breaker panel, as indicated in block 905.

6) At the breaker panel, the user checks to make sure that the receiver/indicator is still in-range by observing that the yellow in-range LED is on, as indicated in block 906.

7) Once the user has confirmed that the receiver/indicator is still in-range, the breakers can be opened or the lines can be disconnected, as indicated in block 907. This can be done either one at a time or in groups, until the sensor detection LED goes off thereby identifying the cable or circuit breaker that is associated with the AC line of interest.

The sensitivity of the light sensor 302 can be set or calibrated. This can be done either manually or automatically. For example, light sensor sensitivity adjustment 304 can be used to manually set a threshold such that any change in ambient lighting is readily sensed.

On power up, the sensor/transmitter can automatically set or calibrate the sensitivity of the light sensor 302. For example, on power-up, the sensor/transmitter can assume that the ambient light level is in a "no alarm" condition. If the sensor/transmitter is powered on in a brightly-lit room by setting it to light mode, it shall assume less light is an alarm condition. Conversely, if the sensor/transmitter is powered on in a dark room, it can assume more light is an alarm.

To change this operation of the light sensor 302, or to adjust for changes in background light levels, the following sequence can be used. Press the Calibrate/Channel Switch briefly, e.g., for approximately 0.5-1.0 second. If the receiver/indicator is in communication with the sensor/transmitter, the Detect LED can illuminate and a beeper can turn off.

Upon releasing the switch, the light level seen by the Light Detector shall become the 'no alarm' condition, and the receiver/indicator shall beep twice to confirm the calibration. The sensor/transmitter shall inhibit detection of alarms for 2-3 seconds after calibration is complete, to allow the user to adjust the position of the sensor/transmitter. The Light Meter can be calibrated with the sensor/transmitter's Power/Mode Switch in either the NCV or Light position.

An adjustable light sensor can compensate for variations in ambient light level. For example, the adjustable light sensor can calibrate the sensor/transmitter upon power on or upon activation of the light sensing capability of the sensor/transmitter. In this manner, the amount of ambient light prior to changing the state of a circuit breaker is accounted for. Thus, a reduction or increase in light from this base level can indicate a change in the state of a circuit breaker.

As a specific implementation example in accordance with one or more embodiments, a wireless AC line power detector system is disclosed. The Wireless AC Line Power Detector system (also referred to as the detector system) consists of three (3) parts: 1) a Transmitter Unit (TU) with integrated clip-on non-contact voltage (NCV) detector and light detector; 2) a wireless Receiver Unit (RU); and 3) an optional External Probe with integrated NCV detector as illustrated in FIGS. 6-9 in accordance with one or more embodiments.

The Transmitter Unit is shown in FIGS. 7a-7c and has the following features: Power/Mode Switch—this switch has three positions for Off, NCV, and Light; Power LED (Green)—this indicator shows that the TU is operating and has battery power; Detect LED (Amber)—this indicator shows that the TU has detected voltage (when in NCV Mode) or a light level change (when in Light Mode); External Probe LED (Yellow)—this indicator shows that the External Probe is attached; NCV Channel—building wiring can be routed through this slot to allow detection of AC voltage; Light Detector—room lighting can be detected through this sensor; External Probe Connector—the External Probe is attached here; Calibrate/Channel Switch—this momentary switch is used to calibrate the Light Mode and to change the wireless channel.

Figure 8A:
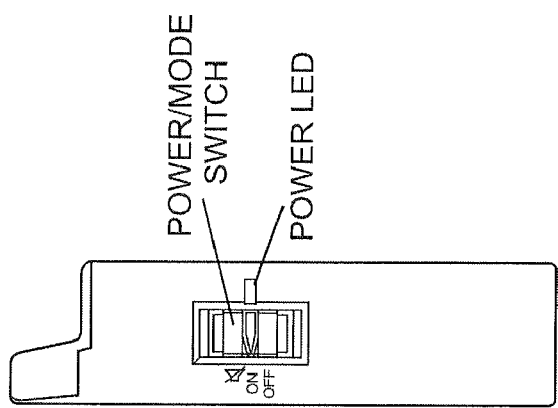
FIG. 8A is a front view of a receiver/indicator, according to an example of an embodiment.
Figure 8B:
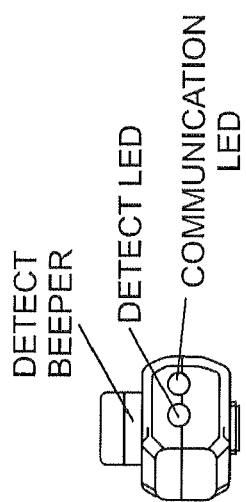
FIG. 8B is a top view of a receiver/indicator, according to an example of an embodiment.

The Receiver Unit is shown in FIGS. 8a and 8b and has the following features: Power/Mode Switch—this switch has three positions for Off, Detect, and Silent; Power LED (Green)—this indicator shows that the RU is operating and has battery power; Detect LED (Amber)—this indicator shows that the TU has detected voltage (when in NCV Mode) or a light level change (when in Light Mode), e.g., a mirror image of the TU's Detect LED; Communication LED (Yellow)—this indicator shows that the RU is communicating with the TU; Detect Beeper—when in Detect Mode, this beeper will track the status of the Detect LED (e.g., cancelled at any time by moving the Power/Mode Switch to Silent).

Figure 10:
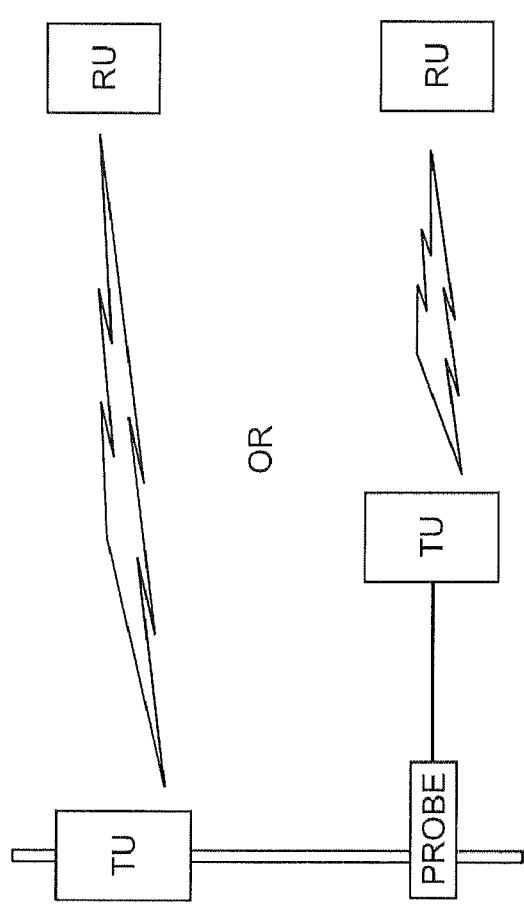
FIG. 10 is a block diagram showing the operation of a sensor/transmitter (TU) and a receiver/indicator (RU) using voltage sensing, according to an example of an embodiment.

For example, the detector system can be directly clamped on installed building wiring, and will detect the voltage applied to the wiring. When voltage is seen, the TU and RU will illuminate the Detect LEDs and enable the Detect Beeper when AC voltage is detected. When the voltage is removed (e.g., by opening the circuit breaker), the Detect LEDs will go out and the Detect Beeper will be silenced (e.g., as illustrated in FIG. 10).

Figure 11:
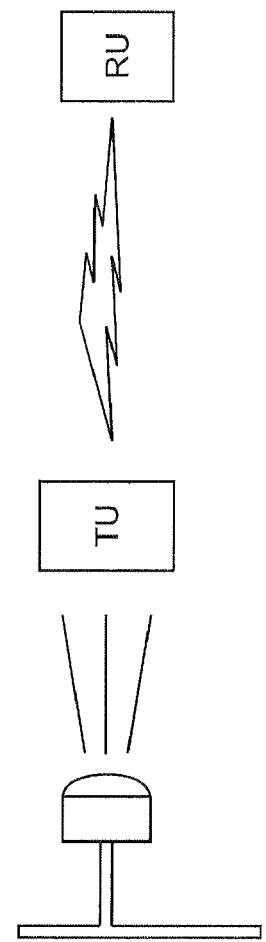
FIG. 11 is a block diagram showing the operation of a sensor/transmitter (TU) and a receiver/indicator (RU) using light sensing, according to an example of an embodiment.

In situations where access to circuit wiring is limited, the detector system can also detect if room lighting changes. The Light Meter can act as either a "light sensor" (the Detect LED lights when room lighting increases), or a "darkness sensor" (the Detect LED lights when room lighting decreases), depending on the calibration of the Light Sensor (e.g., as illustrated in FIG. 11).

For example, on power-up, the detector system assumes the ambient lighting is the "no alarm" condition. If the detector system is powered on in a brightly-lit room, it will assume less light is an alarm condition; if it is powered on in a dark room, it will assume more light is an alarm. To change this operation, or adjust for changes in background light levels, the Calibrate/Channel Switch may be briefly pressed (e.g., approx. 0.5 second). Upon releasing the switch, if the detector system is in an alarm state, the Detect LEDs and Detect Beeper will turn off. The Detect and External Probe LEDs will alternately flash at a 1 Hz rate. If "normal" room lighting needs to be adjusted, do so while the LEDs are flashing. If the Calibrate/Channel Switch is briefly pressed again, the light level seen by the Light Detector will now become the "no alarm" condition. The RU will beep twice to confirm the calibration. The detector system will not detect alarms for several seconds after calibration is complete, to allow the user to adjust the position of the devices.

An optional External Probe can be used to clamp onto tested wiring. The probe is shown in FIG. 9 in accordance with an embodiment. Using the External Probe is exactly like using the NCV Channel. When the External Probe is plugged in, the External Probe LED will be lit, for example.

In accordance with an embodiment, the detector system can operate on one of three (3) channels, to eliminate interference with other wireless devices, and to allow more than one detector system pair to be used simultaneously: Normally for example, the detector system is programmed from the factory to operate on Channel 2. To change to another channel, press the Calibrate/Channel Switch for at least 3 seconds (step 1). During this time, the Communication LED on the RU may go out (e.g., as an indication). After the Calibrate/Channel Switch is released, the Detect and External Probe LEDs on the TU will flash together at a 1 Hz rate (step 2). The RU will beep a number corresponding to the current channel of the TU. If this is the correct channel (step 3), move to step 5 below. Press the Calibrate/Channel Switch briefly (~0.5 second) again (step 4). The TU and RU(s) will move to the next channel in the following round-robin order: CH1→CH2→CH3→CH1, etc. The RU will beep a number corresponding to the new channel number. Once the TU and RU(s) are on the correct channel, press the Calibrate/Channel Switch for at least 3 seconds again (step 5). During this time, the Communication LED on the RU may go out, and the flashing LEDs on the TU may either go out, or freeze in the lit position (e.g., as an indication). The new channel is now stored in the detector system (step 6). The RU will beep a number corresponding to the new channel number again to confirm the action.

This method may also be used to synchronize more than one RU to a single TU, or to recover a RU that has "lost" its transmitter. As a specific example, if TU is on CH3, RU #1 is on CH2, and RU #2 is on CH1, then press the Calibrate/Channel Switch for 3 seconds and RU #1 and #2 will both beep three times. All devices are now on CH3 and the Communication LEDs are lit. Press the Calibrate/Channel Switch for 0.5 second, RU #1 and #2 will both beep once. All devices are now on CH1. Press the Calibrate/Channel Switch for 0.5 second, RU #1 and #2 will both beep twice. All devices are now on CH2. Press the Calibrate/Channel Switch for 3 seconds, RU #1 and #2 will both beep twice. All devices are now programmed to CH2.

In general for an embodiment, the wireless AC voltage detector system may provide either direct non-contact voltage (NCV) measurement of an AC line, using the built-in cable clamp or an external clamp probe, or detect the light output of a lamp connected to the tested line (e.g., using a light-detecting resistor (LDR)), in cases where the wiring is inaccessible. Additionally, various other sensors may be incorporated using the external probe input.

The term "circuit breaker" as used herein can refer to any circuit interruption device, fuse, switch, valve (such as for liquids and gases), or the like, whether for an electrical circuit, a fluid pipe, or any other type of system. For example, the term "circuit breaker" can refer to the automatic circuit interruption device commonly found in homes and offices. As a further example, the term "circuit breaker" can refer to a water valve in a hot water system.

The term "indicate" as used herein can refer to bringing to the attention of a user or alerting a user. For example, an indication can be the turning of a light, the turning off of a light, the turning on of an audible alarm or buzzer, or the turning off of the audible alarm or buzzer.

The term "indicator" as used herein can refer to any device that indicates, as defined above. For example, a light or an audible alarm or buzzer can be an indicator.

The term "non-contact" as used herein can refer to detection by devices that do not require cutting of the insulation of a wire to determine the presence of a voltage or current of the wire. For example, a non-contact sensor can clamp onto a wire without damaging the wire.

The term "active circuit" as used herein can refer to a circuit that is either providing power or is capable of providing power. Thus, an active circuit can be a circuit that has voltage present, such as at the wall receptacles and lights thereof.

The term "associated" as used herein can refer to a relationship between a circuit breaker or an AC line at a breaker panel and a mid-run AC line, a wall outlet, a light, or an electric device. This relationship can be one wherein the circuit breaker or an AC line at a breaker panel allows current or voltage to be provided to the mid-run AC line, the wall outlet, the light, or the electric device.

The term "remote" as used here can refer to being within a different room of the same building, being outside of a building with respect to something that is inside of the building, or being within a different building. The actual distance can be any distance within which wireless communication between the sensor/transmitter and the receiver/indicator can occur.

The term "heat sensor" can be defined to include any type of sensor that can detect or measure heat, including thermometers, pyrometers, bolometers, infrared sensors, and infrared cameras.

According to one or more embodiments, a user can readily determine which of a plurality of different circuit breakers is associated with a particular circuit. Thus, such embodiments mitigate the need to repeatedly turn off circuit breakers, go to the room in which the circuit is being monitored, and check to see if the circuit is active. The amount of time that it typically takes to determine which circuit breaker is associated with which circuit can be substantially reduced.

Embodiments described above illustrate, but do not limit, the invention. It should also be understood that numerous modifications and variations are possible in accordance with the principles of the present invention. Accordingly, the scope of the invention is defined only by the following claims.

I claim:

1. A system comprising:
    a sensor device having at least one sensor adapted to monitor at least one parameter associated with a circuit and provide information on the parameter, wherein the at least one sensor includes:
        a non-contact voltage sensor adapted to detect a voltage level of the circuit;
        a visible light sensor adapted to detect a visible light level associated with the circuit, wherein the visible light sensor has a visible light sensitivity adjustment circuit to set an alarm/no alarm threshold; and
        an external probe that is couplable to the sensor device and adapted to detect at least one of a voltage level, a current level, continuity, a heat level, a sound level, or motion associated with the circuit;
    a wireless transmitter within the sensor device and coupled to the at least one sensor and adapted to transmit the information; and
    a receiver device having a wireless receiver adapted to be in communication with the wireless transmitter of the sensor device to facilitate association of a circuit breaker with the circuit based on the information received on the parameter being monitored.

2. The system as recited in claim 1, wherein the non-contact voltage sensor is adapted to detect a current level of the circuit.

3. The system as recited in claim 1, wherein the sensor device includes:
    a mode switch for a user to select between the non-contact voltage sensor and the visible light sensor; and
    a detect light adapted to provide a detection indication based on the parameter being monitored.

4. The system as recited in claim 1, wherein the sensor device includes a wireless channel switch to select between a plurality of wireless channels for communication between the wireless receiver and the wireless transmitter.

5. The system as recited in claim 1, wherein the external probe comprises an infrared camera adapted to monitor the heat level of the circuit.

6. The system as recited in claim 1, wherein the external probe comprises a non-contact probe adapted to detect a voltage level and a current level of the circuit.

7. The system as recited in claim 1, wherein the sensor device includes:
- an interface to couple to the external probe; and
- an external probe light to indicate when the external probe is coupled to the sensor device.

8. The system as recited in claim 1, wherein the receiver device provides a light that changes state to indicate whether the circuit is active based on the information.

9. The system as recited in claim 1, wherein the receiver device provides an audible indicator that changes state to indicate whether the circuit is active based on the information.

10. The system as recited in claim 1, wherein the non-contact voltage sensor comprises a voltage sensor having plastic prongs that are configured to attach the voltage sensor to a wall outlet.

11. The system as recited in claim 1, wherein the non-contact voltage sensor comprises a voltage sensor that is configured to clamp over an AC line.

12. The system as recited in claim 1, wherein the sensor device includes a light sensitivity adjustment switch for use by an operator to control the visible light sensitivity adjustment circuit.

13. The system as recited in claim 1, wherein the circuit comprises a pipeline and the circuit breaker comprises a pipeline valve, and wherein the external probe comprises a thermal sensor suitable for sensing heat in the pipeline.

14. A method comprising:
- positioning a sensor device adapted to provide information on whether a circuit is active, wherein the information is transmitted wirelessly to a remote location;
- selecting on the sensor device whether to monitor an electrical parameter of the circuit or a visible light level parameter associated with the circuit to provide the information;
- setting a light sensitivity level if the visible light level parameter is to be monitored based on the selecting;
- positioning a receiver device at the remote location to receive the information, wherein the receiver device provides an indication to a user on whether the circuit is active based on the information;
- switching selectively each circuit breaker from among a plurality of circuit breakers; and
- determining which of the circuit breakers is associated with the circuit based on the indication and operation of the circuit breaker.

15. The method as recited in claim 14, comprising coupling an external probe to the sensor device to monitor at least one of a voltage level, a current level, continuity, a heat level, a sound level, or motion associated with the circuit.

16. The method as recited in claim 15, wherein the external probe comprises an infrared camera adapted to monitor the heat level of the circuit.

17. The method as recited in claim 14, wherein the electrical parameter comprises at least one of a current level, a voltage level, and a continuity.

18. The method as recited in claim 14, comprising selecting a wireless channel from among a plurality of wireless channels for communication between the sensor device and the receiver device.

19. The method as recited in claim 14, wherein the indication to a user comprises a visual and/or an audible signal.

20. The method as recited in claim 14, wherein the electrical parameter comprises a non-contact voltage level of the circuit.

21. A sensor/transmitter device comprising:
- a processor;
- a non-contact electrical sensor, coupled to the processor, adapted to monitor a state of an electrical parameter of a circuit and provide an electrical parameter signal to the processor;
- a visible light sensor, coupled to the processor, adapted to monitor a visible light level associated with the circuit and provide a visible light level signal to the processor;
- a visible light sensitivity adjustment circuit, coupled to the visible light sensor and the processor, adapted to set a visible light sensitivity level for the visible light sensor;
- an external probe adapted to couple to the sensor/transmitter device to monitor at least one of a voltage level, a current level, continuity, a heat level, a sound level, or motion and provide an external probe signal to the processor; and
- a wireless transmitter, coupled to the processor, adapted to transmit information provided by the processor based on the electrical parameter signal, the visible light level signal, and/or the external probe signal.

22. The device of claim 21, wherein the external probe comprises an infrared camera adapted to monitor a heat level.

23. The device of claim 21, wherein the external probe comprises a non-contact probe adapted to detect a voltage level and/or a current level.

* * * * *